United States Patent
Van Den Berg et al.

[19]

[11] Patent Number: 6,020,738
[45] Date of Patent: Feb. 1, 2000

[54] DEVICE FOR MAGNETIZING MAGNETORESISTIVE THIN FILM-SENSOR ELEMENTS IN A BRIDGE CONNECTION

[75] Inventors: Hugo Van Den Berg, Herzogenaurach; Wolfgang Schelter, Tegernheim, both of Germany

[73] Assignee: Siemens Aktingesellschaft, Munich, Germany

[21] Appl. No.: 08/945,913

[22] PCT Filed: May 31, 1996

[86] PCT No.: PCT/DE96/00963

§ 371 Date: Feb. 20, 1998

§ 102(e) Date: Feb. 20, 1998

[87] PCT Pub. No.: WO96/38740

PCT Pub. Date: Dec. 5, 1996

[30] Foreign Application Priority Data

Jun. 1, 1995 [DE] Germany .......................... 195 20 178

[51] Int. Cl.[7] .............................. G01R 33/09; H01L 43/08
[52] U.S. Cl. ......................................... 324/252; 338/32 R
[58] Field of Search .......................... 324/117 R, 207.21, 324/249, 252; 338/32 R; 360/113; 365/158

[56] References Cited

U.S. PATENT DOCUMENTS

| | | | |
|---|---|---|---|
| 4,603,365 | 7/1986 | Nakamura | 324/252 X |
| 5,247,278 | 9/1993 | Pant et al. | 338/32 R |
| 5,500,590 | 3/1996 | Pant | 324/252 |

FOREIGN PATENT DOCUMENTS

| | | |
|---|---|---|
| 0 346 817 A2 | 6/1989 | European Pat. Off. . |
| 0 483 373 A1 | 5/1991 | European Pat. Off. . |
| 42 43 357 A1 | 12/1992 | Germany . |
| 42 43 358 A1 | 12/1992 | Germany . |
| 42 32 244 | 3/1994 | Germany . |
| 93 12 674 | 9/1995 | Germany . |

OTHER PUBLICATIONS

Daughton et al., GMR Materials For Low Field Applications, IEEE Transactions on Magnetics, vol. 29, No. 6 Nov. 1993.

Soviet Inventions Illustrated, Week X25, 483,359–494,362, Jul. 28, 1976.

*Primary Examiner*—Gerard Strecker
*Attorney, Agent, or Firm*—Kenyon & Kenyon

[57] ABSTRACT

The magnetizations of the bias-layer parts of several sensor elements interconnected to form a bridge are to be set using the present device. These sensor elements are arranged on a common substrate and display an increased magnetoresistive effect. The present device has several conductive-track parts in such an arrangement that, with a predetermined position of the conductive-track parts with respect to the sensor elements of the bridge circuit, in each case one conductive-track part is associated with at least one sensor element. A set current of a predetermined direction and strength is conducted over each conductive-track part in such a manner that a predetermined direction of orientation of the magnetization can be set in fixed manner in the bias-layer part of the corresponding associated sensor element.

14 Claims, 4 Drawing Sheets

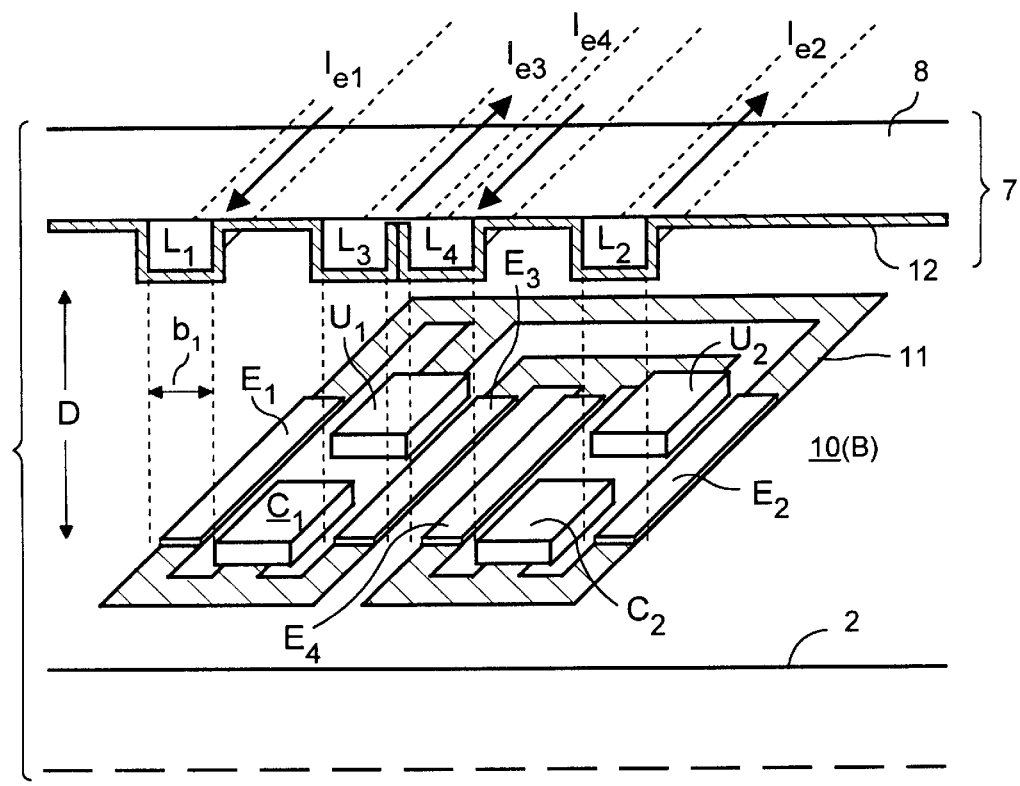
F I G. 3
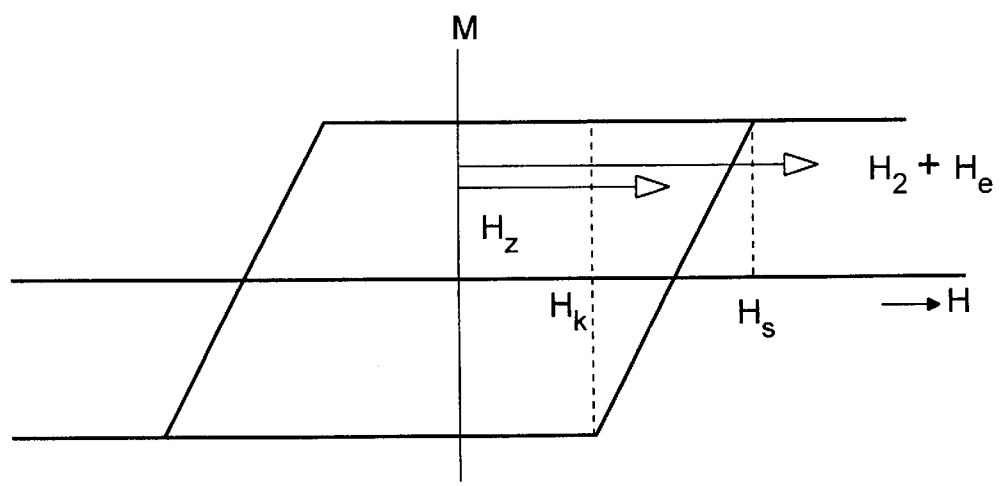
F I G. 5

DEVICE FOR MAGNETIZING MAGNETORESISTIVE THIN FILM-SENSOR ELEMENTS IN A BRIDGE CONNECTION

FIELD OF THE INVENTION

The present invention relates to a device for setting the magnetizations of the bias layer parts in sensor elements which are interconnected to form a bridge.

BACKGROUND INFORMATION

In layers of ferromagnetic transition metals such as Ni, Fe or Co and their alloys, the electric resistance may be dependent on the strength and direction of a magnetic field which passes through the material. The effect which occurs in the case of such layers is known as anisotropic magnetoresistance (AMR), or anisotropic magneto-resistive effect. It is based physically on the different scattering cross sections of electrons with different spin and the spin polarity of the D band. The electrons are therefore referred to as majority or minority electrons. For similar magneto-resistive sensors, a thin film of such a magneto-resistive material with magnetization in the plane of the layer is generally provided. The change in resistance upon rotation of the magnetization with respect to the direction of the current can amount to a few per cent of the normal isotropic (ohmic) resistance.

Furthermore, for some time magneto-resistive multi-layer systems have been known which contain several ferromagnetic layers arranged in a stack, which are separated from each other by metallic intermediate layers and the magnetization of each of which lies in the plane of the layer. The thicknesses of the individual layers are, in this connection, definitely less than the mean free path of the conduction electrons. In such multi-layer systems, a so-called giant magneto-resistive effect or giant magneto-resistance (GMR) can occur now in addition to the anisotropic magnetoresistive effect (see, for example, European Patent No. 483 373). Such a GMR effect is based on the different degrees of scattering of majority and minority conduction electrons at the boundary surfaces between the ferromagnetic layers and the adjacent intermediate layers, as well as on scattering effects within the layers, particularly upon the use of alloys. The GMR effect is, in this case, an isotropic effect. It can be considerably greater than the AMR effect and assume values of up to 70% of the normal isotropic resistance. In similar multi-layer systems which display a GMR effect, adjacent metallic magnetic layers are initially magnetized in opposite directions, a bias layer or bias-layer part being magnetically harder than a measurement layer. Under the influence of an external magnetic field, the initial anti-parallel alignment of the magnetizations can be converted into a parallel alignment. This fact is utilized in such magnetic field sensors.

From German Utility Model No. 93 12 674.3 a magnetic field sensor is known which has sensor elements which are interconnected to form a Wheatstone bridge. These sensor elements have an anisotropic magneto-resistance AMR. In the bridge circuit of such a sensor, the fact can be utilized that, in the individual sensor elements, the magneto-resistive effect of the AMR layers depends on the angle between the magnetization of the corresponding layer and the direction of a current flowing through it. The individual sensor elements can advantageously be so interconnected by suitable structuring to form the bridge that the directions of the current in the two pairs of diagonally opposite bridge elements formed by the two bridge branches form a predetermined angle.

If it were desired to construct corresponding bridge circuits with thin-film sensor elements which have a GMR effect, the problem arises that there is no dependence of the magneto-resistive effect on the direction of the current flow. The change in resistance is therefore the same for all elements in the case of uniform magnetization of the bias-layer parts and of the measurement layers of these elements. Sensor elements with GMR effect could therefore be interconnected to form a Wheatstone bridge only if different directions of the magnetization of their bias-layer parts could be set for the pairs of diagonal bridge elements. With the extremely small dimensions required for such sensors, which dimensions are in the millimeter range or below, no practical possibility, however, was seen up to now of setting different directions of magnetization in the bias-layer parts of adjacent elements in such a narrow space, so that it was not possible up to now to think of producing bridge circuits with GMR sensors on an industrial scale.

SUMMARY OF THE INVENTION

An object of the present invention is to provide a device with which, in a relatively simple manner, the orientations of the magnetizations of the bias-layer parts can be set in sensor elements which are interconnected to form a bridge and which, with, in each case, the same thin-film structure, are arranged alongside each other on a common substrate and display an increased magneto-resistive effect.

This object is achieved in accordance with the present invention in the manner that the device has a plurality of conductive-track parts which are separated in space from the sensor elements and have such an arrangement that, with a predetermined position of the conductive-track parts with respect to the sensor elements of the bridge circuit, in each case one conductive-track part is associated with at least one sensor element, and contains means for conducting a set current of predetermined direction and strength in such a manner over each conductive-track part that a predetermined direction of orientation of the magnetization can be permanently set, in the bias-layer part of, in each case, at least one associated sensor element.

The advantages obtained with this development of the device consist, in particular, therein that, for the first time, a possibility has been created of developing GMR sensor elements with the same structure in a bridge circuit of extremely small dimensions at reasonable expense for large-scale industrial use, since by means of the set currents through the conductive-track parts associated in each case with the individual sensor elements, magnetizations with predetermined orientations can be "fixed" in simple manner in a very narrow space in the corresponding bias-layer parts of the individual sensor elements. In this connection, the bias-layer part can consist either of a single magnetically harder bias layer or of a system of bias layers which can be developed, in particular, also as an artificial antiferromagnet (See German Published Patent Application No. 42 43 358). With the magnetizing device of the present invention, therefore, the bias-layer part which is magnetically harder than other magnetic layers of a sensor element can, in an advantageously simple manner, be magnetized once and for all in a predetermined direction of orientation by means of the magnetic field produced by the corresponding set current. The corresponding set current should in this connection be so high that a magnetic field which is sufficiently strong for the magnetizing of the bias-layer part can be obtained with it. The magnetic field of the set current may in this connection possibly have an external supporting or auxiliary field superimposed on it. On the other hand, due to the predetermined magnetic hardness (coercive field strength) of the bias-layer part, an external magnetic field component which is to be detected is not capable of remagnetizing the bias-layer part.

BRIEF DESCRIPTION OF THE DRAWINGS

FIG. 3 shows an oblique view on a part of a similar magnetizing device with magnetic field sensor.

FIG. 5 shows the hysteresis curve of a bias-layer part of a sensor element of a magnetic field sensor.

DETAILED DESCRIPTION

Figure 1:
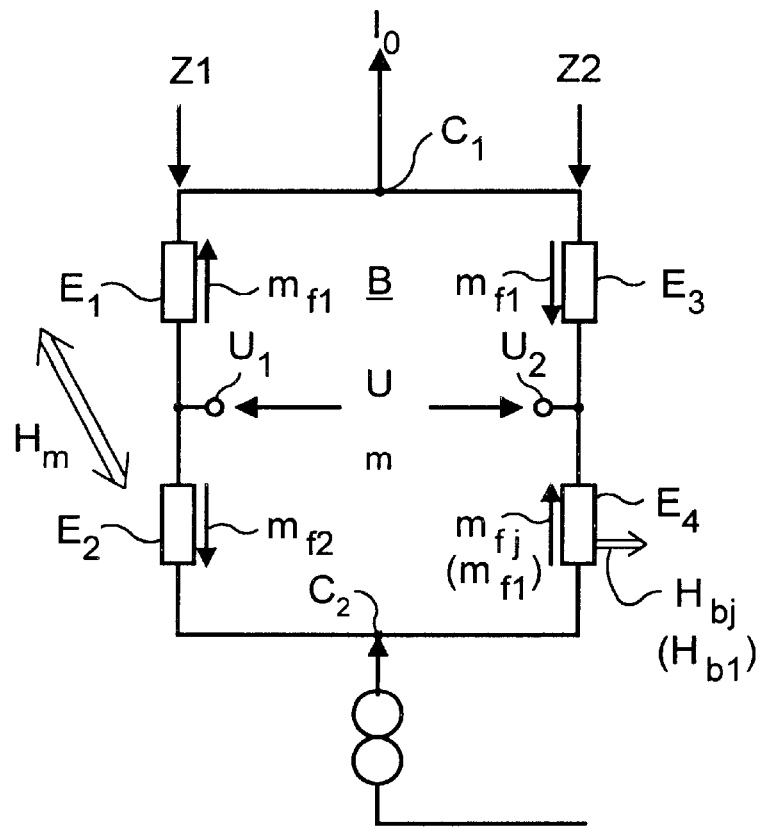
FIG. 1 shows the wiring diagram of a bridge circuit of a magnetic field sensor with GMR sensor elements.
Figure 2:
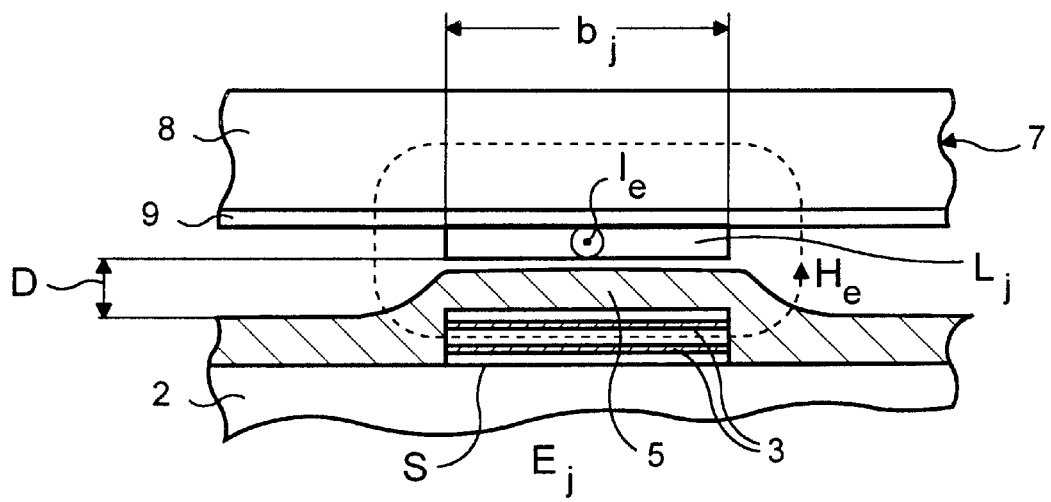
FIG. 2 shows a cross section through a magnetizing device in accordance with the present invention in the region of a bridge element of such a sensor.

The device in accordance with the invention is intended for setting the magnetizations of the bias-layer parts in GMR sensor elements of a magnetic field sensor which are interconnected so as to form a bridge. The corresponding known bridge circuit of this sensor can be noted from FIG. 1. The bridge B shown contains two bridge branches Z1 and Z2 which are connected in parallel between two terminals $C_1$ and $C_2$ of the bridge. A bridge current $I_0$ is to be conducted over the bridge B at terminals $C_1$ and $C_2$. Each of bridge branches Z1 and Z2 contains two bridge elements $E_1$ and $E_2$, and $E_3$ and $E_4$ respectively, connected in series. Between the two elements of each bridge circuit there are measurement points $U_1$ and $U_2$ respectively of the bridge. A measurement voltage $U_m$ can be obtained at these measurement points. The individual sensor elements $E_j$ (with $1 \leq j \leq 4$) of bridge circuit B are to be constructed from known magnetoresistive multi-layer systems which display a GMR effect (see, for instance, European Patent No. 0 483 373, German Published Patent Application Nos. 42 32 244, 42 43 357 or 42 43 358). With the bridge circuit of the sensor elements, an at least substantially temperature-compensated measurement signal which is also compensated with respect to mechanical stresses can be obtained as a function of an external magnetic field component. This is achieved by the same thin-film structure of the individual sensor elements on the common substrate. By a layer structure it is to be understood here that each sensor element has a predetermined layer sequence with predetermined thickness of the individual layers. The layer sequences and the thicknesses of corresponding layers from all sensor elements are in this connection the same. Such layer sequences can be produced in an advantageously simple manner. All sensor elements $E_j$ have a bias-layer part with a predetermined direction of orientation of the magnetization $m_{fj}$. In FIG. 1 these magnetizations are indicated by arrows along the individual sensor elements. As can be noted from the figure, each of the two pairs $E_1$–$E_4$ and $E_2$–$E_3$ of diagonal sensor elements has the same directions of orientation of the bias magnetizations $m_{fj}$, the direction of magnetization of the one pair being opposite that of the other pair. Furthermore, each of the individual multi-layer systems contains a measurement layer which is magnetically softer than the bias-layer part and is separated from said bias-layer part by a non-magnetic intermediate layer. A similar layer system with GMR effect can, for instance, be the basic system for the development of a sensor element $E_j$. Each of the, for instance, strip-shaped, sensor elements $E_j$ preferably has a plurality of corresponding magnetic and non-magnetic layers. Such a system of multiple layers may be used for the sensor element $E_j$ which is indicated in FIG. 2. Its multi-layer system S which is developed on a substrate 2 and which includes, for instance, a bias-layer part 3 with a plurality of bias layers is covered by a passivation layer 5 which includes of a non-magnetic material and, particularly, an insulating material. The sensor element $E_j$ need not necessarily take up, with its multi-layer system, a rectangular base surface on substrate 2. A meandering shape can, for instance, also be used. For the interconnection of the individual sensor elements $E_j$ to form a bridge circuit B in accordance with FIG. 1, each element with its GMR layer system is provided with at least two contacts. These contacts are either both arranged on the top measurement layer of the corresponding magnetic-field-sensitive layer system so that the bridge current flows, on the average, parallel to the layer planes (so-called "current-in-plane [CIP] system"), or one contact is arranged on the uppermost layer and one on the lowermost layer so that then the bridge current flows on the average perpendicular to the layer planes (so-called "current-perpendicular-to-plane [CPP] system"). In FIG. 2, however, electric connecting contacts on the multi-layer system have been omitted for reasons of clarity.

For magnetization of bias-layer part 3 of each sensor element $E_j$ with a predetermined shape of its base surface and a predetermined direction of orientation of the magnetization, a setting device 7 in accordance with the present invention is provided. This device, as shown in FIG. 2, has a conductive-track support 8 on the bottom side of which, facing the individual sensor elements $E_j$, conductive-track parts $L_j$ made of an electrically well-conducting material such as Cu or Ag are arranged. An insulating layer 9 may be provided between the conducting-track support 8 and the individual conducting-track parts $L_j$. The conductive-track parts $L_j$ should be so arranged on the bottom of the conductive-track support 8 that, upon a positioning of the support 8 above the bridge circuit, in each case one conductive-track part $L_j$ extends preferably at least approximately parallel to at least one sensor element $E_j$ associated with it. The corresponding conductive-track width $b_j$ is generally not much larger than the width of the layer system S of the associated sensor element $E_j$ so as to avoid a mutual influencing of closely adjacent conductive-track parts with different directions of flow of current. With a setting current $I_e$ through each conductive-track part $L_j$ there can then be produced a magnetic setting field $H_e$ of such direction and strength that a preferred direction of the magnetization can be set in the bias-layer part 3 of the associated multi-layer system S. Upon this magnetization, the distance D between a conductive-track part $L_j$ and the associated multi-layer system S should preferably be selected smaller than the width $L_j$ of the conduction track since, otherwise, large intensities of the set current $I_e$ would be necessary in order to produce the magnetic fields of the strength $H_e$. In general, the distance D amounts to only a few μm. The conductive-track part $L_j$ can possibly also rest directly on the sensor element $E_j$ or its layer 5.

Differing from the conductive-track support 8 shown in FIG. 2, other holding means are, of course, also suitable for a positioning of the conductive-track parts with respect to, in each case, at least one associated sensor element.

FIG. 3 shows a corresponding setting device 7 for a magnetic field sensor 10 having four GMR sensor elements $E_1$ to $E_4$ which are preferably arranged alongside of each other on a common substrate 2. Of course, other possible arrangements can also be selected for the sensor elements on the substrate. The sensor elements $E_1$ to $E_4$ shown are connected with each other and with contacting surfaces of the terminal points $C_1$, $C_2$ and $U_1$, $U_2$, so-called contact pads, by contact tracks 11 so as to form the bridge B shown in FIG. 1. With each sensor element $E_j$ there is associated a conductive-track part $L_j$ (with $1 \leq j \leq 4$) on the bottom of a conductive-track support 8 of setting device 7. Conductive-track parts $L_j$ can furthermore be provided with an insulating layer 12 in order to avoid short circuits between adjacent conductive-track parts. The position of the individual conductive-track parts $L_j$ on the conductive-track support 8 is so selected that, when the setting device 7 is brought close to magnetic field sensor 10, the individual conductive-track parts $L_j$ extend precisely parallel to the associated sensor elements $E_j$ while maintaining a very slight distance D of, in general, a few $\mu$m. The individual conductive-track parts $L_1$ to $L_4$ having for instance equal conductive-track widths $b_1$ to $b_4$ are traversed by set currents $I_{e1}$ to $I^{e4}$ in the directions of flow indicated by arrows to produce the desired bias-layer orientations in the individual sensor elements.

Figure 4:
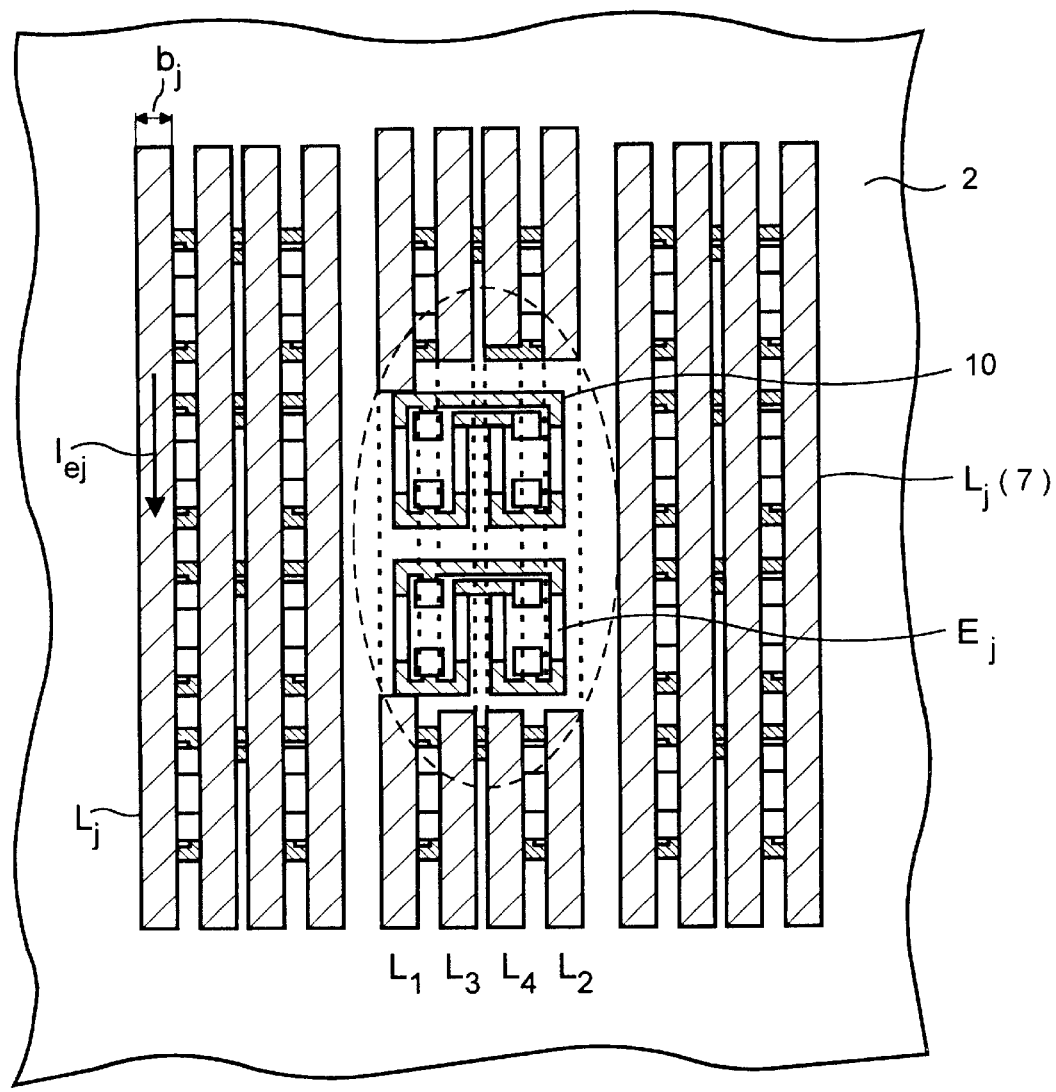
FIG. 4 shows a top view of the device shown in FIG. 3.

For an economical manufacture of similar magnetic field sensors 10, a plurality of individual sensors are advantageously produced simultaneously on a common substrate, for instance, a silicon disk. A similar example having a plurality of magnetic field sensors on a disk-shaped Si-substrate 2 forms the basis of FIG. 4. The bias-layer parts of the individual GMR sensor elements $E_j$ of these magnetic field sensors 10 are produced by sufficiently high set currents $I_{ej}$ in the associated conductive-track parts $L_j$ or $L_1$ to $L_4$ of a setting device in accordance with the present invention. In this connection, several conductive-track parts for several sensor elements can be formed by continuous conductive tracks $L_j$. The magnetic setting field $H_e$ which is to be induced by these conductive tracks must, in many cases, be relatively high and can, for instance, amount to 1 to 2 kOe. The current intensity per $\mu$m of the conductive-track width $b_j$ then amounts to about 150 to 300 mA. For a typical conductive-track width $b_j$ of 50 $\mu$m a current $I_{ej}$ of 7 to 15 A is then obtained. Such a high current leads to a considerable heating of the conductive track and results in the danger of burning-out thereof under constant load. Therefore a pulsating set current $I_{ej}$ of short pulse duration of for instance less than 100 ms can advantageously be provided. Furthermore, the thickness of the conductive tracks or their conductive-track parts $L_j$ is advantageously selected as large as possible since, on the one hand, the resistance, and thus also the production of heat, is inversely proportional to the thickness, and, on the other hand, the heat capacitance increases proportionally to the thickness. However, limits are set by the technology employed on the specific conductive-track thicknesses which can be obtained. Furthermore removal of the heat produced by the conductive tracks is advantageously possible by thermal conduction via the conductive-track support. This support should therefore advisedly includes a thermally well-conducting material and possibly be cooled.

Another possibility for reducing the set current in the conductive tracks is to apply, in addition, an external supporting field of the strength $H_z$. This supporting field should be directed parallel or anti-parallel to the set field $H_e$ produced by the corresponding conductive-track part $L_j$. The supporting field $H_z$ and the set field $H_e$ then allow a predetermined threshold value of the field strength of the magnetic field to which the bias-layer part of the GMR multi-layer system is exposed to be exceeded as necessary. Such field conditions, as are typical for a bias layer or for a system of an artificial anti-ferromagnet (see German Published Patent Application No. 42 43 358), can be noted from the graph of FIG. 5. In that graph, the field strength H is plotted in the direction of the abscissae and the magnetization M in the direction of the ordinates, in both cases in arbitrary units. For the hysteresis curve shown, the values $H_s$ represent a threshold field strength which, in accordance with the embodiment assumed, may be the saturation field strength; furthermore, $H_c$ represents the coercive field strength and $H_k$ the field strength at which the magnetization M suddenly starts to increase from the value of the negative saturation magnetization with an increase in the field strength. $H_z$ is selected approximately equal to $(H_k+H_s)/2$. The sum of the amounts of $H_z$ and of the setting field $H_e$ is greater than the saturation field strength $H_s$, while $||H_z|-|H_e||$ is less than $H_k$. $H_z$ and $H_e$ are in this connection parallel to each other. The direction $H_z$ is reversed during the setting. In a first phase of the setting, $H_e$ and $H_z$ are in the same direction on the conductive tracks $L_1$ and $L_4$ (in accordance with FIG. 3) and the bias-layer magnetization is set in the corresponding sensor elements $E_1$ and $E_4$. In the other elements $E_2$ and $E_3$, on the other hand, there prevails a field $|H_z|-|H_e|$ which is too small to impair the bias-layer magnetizations in these elements. With oppositely directed $H_z$, the roles of the pairs of elements $E_1$–$E_4$ and $E_2$–$E_3$ are reversed so that the elements $E_2$ and $E_3$ are then magnetized in opposite directions. In the event that $H_k \approx H_s/2$ and $H_e \approx 1.1 * (H_s-H_k)/2$, the intensity of the set current is decreased by a factor of 1.1:4. With the same conductive-track geometry the heat produced is then less by a factor of 1:9.

In certain multi-layer systems, particularly so-called "exchange-biased systems" with bias-layer part consisting of an NiFe layer with FeMn base (see, for instance, European Patent No. 0 346 817), it may be advantageous to expose the layer system to increased temperature conditions during the magnetization of its bias-layer part. Thus, for instance, an increase in temperature to about 150° C. is favorable for the FeMn layer of the layered system. A corresponding increase in temperature can be produced by arranging the layered system in a heated space heated by, for example, a heating device 30.

In accordance with the embodiment associated with the graph of FIG. 5 it was assumed that an external magnetic supporting field is selected which has such a field strength $H_z$ that the threshold field strength $H_s$ cannot be exceeded by it alone. Of course, it is also possible to provide a similarly high magnetic supporting field and then to develop an opposing field with the setting field of a conductive track $L_j$ of the device in accordance with the present invention so that the supporting field is reduced accordingly.

Figure 6:
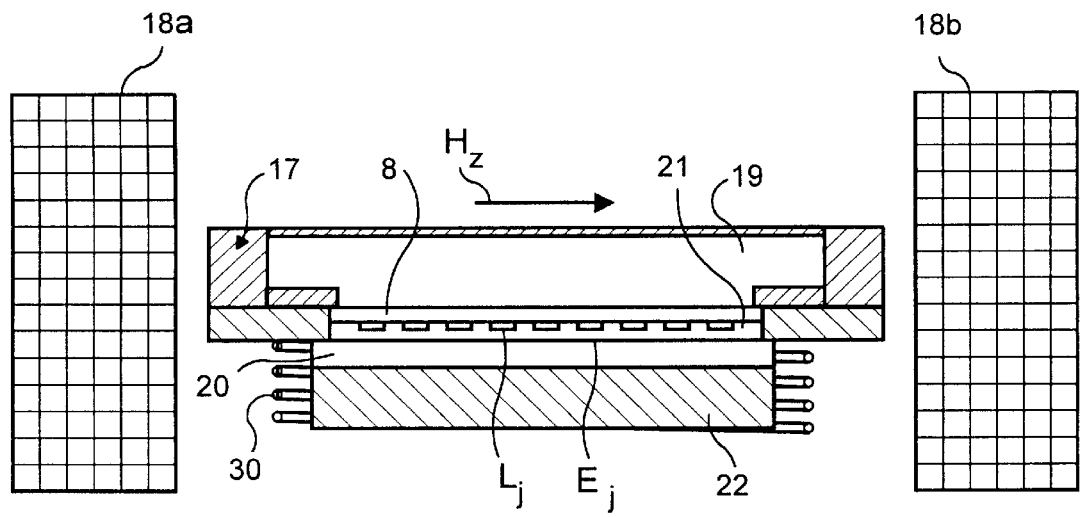
FIG. 6 shows a magnetizing device based on this hysteresis curve.

FIG. 6 shows the essential parts of a device in accordance with the present invention for setting the bias-layer magnetization of GMR sensor elements. The structure of this device, designated generally 17, is similar to that of known optical contact exposure systems used in microstructure technology. The distinguishing features between the magnetizing device of the present invention and these known systems are indicated below. In this connection, 18a and 18b in the figure designate a magnetic field source, 19 a cooling chamber, 20 a sensor substrate with GMR sensor elements $E_j$ merely indicated in the figure, present thereon, 21 an evacuatable intermediate space, and 22 a device for positioning the sensor substrate 20 with respect to a conductive-track support 8 bearing conductive tracks $L_j$.

As field source for producing the additional field $H_z$, use may be made, in accordance with the embodiment shown, of permanent magnets 18a and 18b, between the magnetic poles of which the conductive tracks $L_j$ and the associated sensor elements extend. A reversal of field can take place, for instance, by rotation of the entire magnetic system around an axis perpendicular to the field of the conductive tracks $L_j$. However, one can also provide two separate magnetic field regions with opposite directions of field into which the structure having the conductive-track support and the sensor substrate are introduced one after the other. Of course, for the production of the field $H_z$, use can also be made of magnetic field coils which, for instance, surround the conductive-track support and the associated sensor substrate.

Furthermore, a high-power pulse generator with connections to the conductive-track supports may be necessary. Since the set currents are relatively high, dependable low-ohmic contacts are required. A suitable bonding or soldering of connecting wires to the conductive-track support can be effected for an advantageous multiple use of each conductive-track configuration.

Furthermore, it may be advisable to provide an evacuatable intermediate space 21 in order to be able to maintain the distance between sensor substrate 20 and conductive-track support 8 over the entire contact surface sufficiently small. For the production of a vacuum, the air is, for instance, drawn off from the intermediate space. In this way, the requirements for the conductive-track-support sensor substrate spacing D can be satisfied relatively easily, D being of the order of magnitude of 10 $\mu$m. Only in the case of sensors having very small lateral dimensions and in the case of non-planar sensor substrates can problems occur. In such case, flexible supports and/or sensor substrates can be used. The vacuum in the intermediate space sees to it that the shape of the conductive-track support and of the sensor substrate fit each other.

Figure 7:
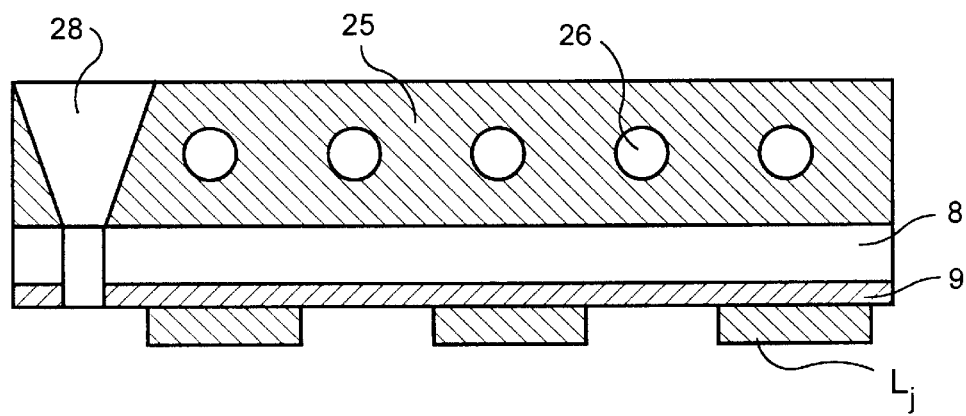
FIG. 7 shows another embodiment of a magnetizing device in accordance with the present invention.

In addition to this, an advantageous cooling of the conductive-track support 8 is also possible. In accordance with FIG. 6, cooling space 19 can be used for this purpose, a liquid or gaseous cooling fluid being conducted through it. In addition to, or instead of this, a cooling body having a large heat capacitance is suitable for the removal of heat. An example of this is shown in FIG. 7. In accordance therewith, a cooling body 25 which, in addition, may also be provided with cooling channels 26 for the conducting of a coolant, can be provided on a conductive-track support 8 on the side thereof facing away from the conductive tracks $L_j$. As can further be noted from the figure, cooling body 25 has an adjustment hole 28. In this way, an optical adjustment of the cooling body or of its conductive tracks connected with it with respect to a corresponding mark on the surface of a sensor substrate is possible. Similar optical methods are used in microstructure technology to position a generally transparent contact mask with respect to a wafer. Because of the generally non-transparent conductive-track support 8 and the cooling body 25, the adjustment hole 28 is in this case advantageous. The required accuracy of positioning need not satisfy the demands customary in microstructure technology. For this reason, other non-optical methods, such as, for instance, electrical contacts, also enter into consideration for the adjustment.

What is claimed is:

1. A device for setting magnetizations of bias-layer parts in magneto-resistive sensor elements which are interconnected to form a bridge circuit and which have similar thin-film structures on a common substrate and display an enhanced magneto-resistive effect, each sensor element including a magnetically harder bias-layer part having a predetermined direction of orientation of a magnetization and a measurement layer, which is magnetically softer than the bias-layer part and is separated from the bias-layer part by a nonmagnetic intermediate layer, the device comprising:

a plurality of conductive-track parts;

means for arranging each one of the conductive-track parts in a predetermined position such that each one is associated with and separated from at least one of the sensor elements, the arranging means being removably coupled to the sensor elements; and means for conducting a set current of a predetermined direction and strength in such a manner over each of the plurality of conductive-track parts so that the predetermined direction of orientation of the magnetization can be permanently set once and for all in the bias-layer part of at least one associated sensor element.

2. The device according to claim 1, wherein each one of the plurality of conductive-track parts is arranged approximately parallel to at least one associated sensor element.

3. The device according to claim 1, wherein by the set current in each one of the plurality of the conductive-track parts associated with each associated sensor element, the bias-layer part of the associated sensor element is subjected to a magnetic field having a strength which allows the direction of orientation of the magnetization of the bias-layer part to be permanently set.

4. The device according to claim 9, further comprising means for cooling the conductive-track support the cooling means being coupled to the conductive-track parts.

5. The device according to claim 4, wherein the predetermined direction of orientation of magnetization in the bias-layer parts of two of the sensor elements present in the supporting field can be set at the same time due to the predetermined set currents in the associated conductive-track parts, while in the remaining sensor elements no orientation is possible due to other set currents in the conductive-track parts associated with the remaining parts.

6. The device according to claim 1, further comprising a heating device coupled to the sensor elements, the heating device providing a temperature of approximately 150° C. at the time of orientation of the bias-layer parts of the sensor elements.

7. The device according to claim 1, wherein the set current pulsates.

8. The device according to claim 1, wherein the conductive-track parts include a material having good electrical conductivity.

9. The device according to claim 1, wherein the conductive-track parts are fastened on a common conductive-track support.

10. The device according to claim 9, wherein the conductive-track support includes a thermally conductive material for removing, by thermal conduction over the conductive-track support, heat produced by the conductive-track parts.

11. The device according to claim 1, wherein each sensor element is subjected to a supporting field induced by a magnetic field source, which is of such strength that when a magnetic field produced by the set current in the conductive-track part is superimposed on the supporting field, the direction of orientation of the magnetization of the bias-layer part is permanently set.

12. The device according to claim 10, wherein the conductive-track support is connected on a side facing away from the conductive-track parts to a cooling body having cooling channels for a coolant.

13. The device according to claim 9, comprising means for adjusting the conductive-track support above the sensor elements of the bridge circuit.

14. The device according to claim 1, wherein the sensor elements are arranged alongside of each other in the bridge circuit.

* * * * *